US012527089B2

(12) United States Patent
Sun

(10) Patent No.: US 12,527,089 B2
(45) Date of Patent: Jan. 13, 2026

(54) DISPLAY BACKPLATE AND MOBILE TERMINAL

(71) Applicant: TCL CHINA STAR OPTOELECTRONICS TECHNOLOGY CO., LTD., Shenzhen (CN)

(72) Inventor: Bo Sun, Shenzhen (CN)

(*) Notice: Subject to any disclaimer, the term of this patent is extended or adjusted under 35 U.S.C. 154(b) by 577 days.

(21) Appl. No.: 17/988,807

(22) Filed: Nov. 17, 2022

(65) Prior Publication Data

US 2024/0113132 A1 Apr. 4, 2024

(30) Foreign Application Priority Data

Sep. 29, 2022 (CN) .......................... 202211199817.7

(51) Int. Cl.
*G09G 3/36* (2006.01)
*H10D 86/40* (2025.01)
*H10D 86/60* (2025.01)
*H01L 25/16* (2023.01)

(52) U.S. Cl.
CPC ........... *H10D 86/60* (2025.01); *H10D 86/441* (2025.01); *H01L 25/167* (2013.01)

(58) Field of Classification Search
CPC ...... G09G 3/32; G09G 3/3208; G09G 3/3406; G02F 1/13452; H10D 86/60; H10D 86/441; H10D 86/481
See application file for complete search history.

(56) References Cited

U.S. PATENT DOCUMENTS

| | | | | |
|---|---|---|---|---|
| 8,913,090 B2* | 12/2014 | Chung | ................. | G09G 3/3233 345/690 |
| 10,262,592 B2* | 4/2019 | Kang | .................. | G09G 3/3233 |
| 10,297,202 B2* | 5/2019 | Xiang | .................. | G09G 3/3266 |
| 11,468,835 B2* | 10/2022 | Ma | ........................ | G09G 3/3233 |
| 2015/0187281 A1* | 7/2015 | Lee | ...................... | G09G 3/3258 345/212 |
| 2015/0243203 A1* | 8/2015 | Kim | ..................... | G09G 3/2092 345/212 |
| 2021/0134215 A1* | 5/2021 | Chun | .................. | G09G 3/3233 |
| 2024/0194121 A1* | 6/2024 | Sun | ....................... | G09G 3/3233 |

* cited by examiner

*Primary Examiner* — Joe H Cheng

(57) ABSTRACT

A display backplate and a mobile terminal are disclosed. A luminescent unit of the display backplate includes a switch transistor, a driving transistor, a luminescent component, and a storage capacitor. The driving transistor and the switch transistor are connected at a first node. The luminescent component and the driving transistor are connected at a second node. A first electrode plate of the storage capacitor, the switch transistor, and the driving transistor are connected at the first node. A second electrode plate of the storage capacitor is connected to a first constant-voltage signal line.

11 Claims, 8 Drawing Sheets

DISPLAY BACKPLATE AND MOBILE TERMINAL

This application claims priority under 35 U.S.C. § 119 of China Application No. 202211199817.7 filed on Sep. 29, 2022, the disclosure of which is hereby incorporated by reference in their entirety.

FIELD

The present disclosure relates to a field of display technologies, and more particularly, to a display backplate and a mobile terminal.

BACKGROUND

Typically, in conventional display products, e.g., liquid crystal display (LCD) devices, organic light-emitting diode (OLED) devices, mini LED devices, and micro LED devices, pixels are driven by a driving circuit having low-temperature polysilicon or metal oxides.

Please refer to FIG. 1. FIG. 1 is a structural schematic view showing a conventional pixel driving circuit. The pixel driving circuit includes a switch transistor T1, a driving transistor T2, and a storage capacitor Cst. When the switch transistor T1 is turned on, the storage capacitor Cst is written into the switch transistor T1 by a data signal line Vdata. Meanwhile, the second driving transistor T2 is turned on by a voltage, and a current flows through a luminescent device and makes the luminescent device emit light. However, a capacitance value Cgs between a gate and a source of the driving transistor is a storage capacitor of the entire pixel driving circuit. Therefore, the capacitance value Cgs between the gate and the source of the driving transistor may reach 1 pF, resulting in carrier charges easy to enter a gate insulating layer of the driving transistor. Consequently, electrical drift occurs on the driving transistor, which reduces stability of products.

SUMMARY

The present disclosure provides a display backplate and a mobile terminal to solve a technical issue of electrical drift occurring on a driving transistor of pixel driving circuits.

To solve the above technical issue, technical solutions provided by the present disclosure are described as follows.

The present disclosure provides a display backplate, comprising a plurality of luminescent units, wherein each of the luminescent units comprises:
  a switch transistor;
  a driving transistor connected to the switch transistor at a first node;
  a luminescent component connected to the driving transistor at a second node; and
  a storage capacitor, wherein the storage capacitor comprises a first electrode plate and a second electrode plate, the first electrode plate is connected to the switch transistor and the driving transistor at the first node, and the second electrode plate is connected to a first constant-voltage signal line.

In the display backplate of the present disclosure, the luminescent component comprises a first terminal, a second terminal, and a luminescent device electrically connected to the first terminal and the second terminal; and
  wherein the first terminal is connected to the driving transistor at the second node, and the second terminal is connected to the first constant-voltage signal line.

In the display backplate of the present disclosure, each of the luminescent units comprises a first connecting line disposed between the first terminal and a first data signal line of the display backplate, and the first connecting line is insulated from the first terminal and the first data signal line; and
  wherein the first connecting line extends from the first constant-voltage signal line and is electrically connected to the first constant-voltage signal line.

In the display backplate of the present disclosure, along a direction of a first scan signal line of the display backplate, a distance between the first connecting line and the first terminal is less than a distance between the first connecting line and the first data signal line.

In the display backplate of the present disclosure, each of the luminescent units comprises a reset transistor, and the reset transistor is connected to the driving transistor and the luminescent component at the second node;
  wherein each of the luminescent units comprises a second connecting line, the second connecting line is connected between the storage capacitor and a second data signal line of the display backplate, and the first data signal line is opposite and parallel to the second data signal line; and
  wherein the second connecting line extends from the reset transistor to driving transistor and the first terminal, the reset transistor is electrically connected to the first terminal and the driving transistor by the second connecting line, and the driving transistor is disposed between the reset transistor and the first terminal.

In the display backplate of the present disclosure, along a direction of a first scan signal line of the display backplate, a distance between the storage capacitor and the first data signal line is less than a distance between the storage capacitor and the second data signal line.

In the display backplate of the present disclosure, the first terminal, the second terminal, the second electrode plate, the first connecting line, the second connecting line, the first data signal line, and the second data signal line are formed of a first metal layer; and
  the first electrode plate, the first scan signal line, and the first constant-voltage signal line are formed of a second metal layer, and the first metal layer and the second metal layer are disposed on different layers.

In the display backplate of the present disclosure, the display backplate comprises a second constant-voltage signal line electrically connected to the driving transistor, and the second constant-voltage signal line and the first constant-voltage signal line are disposed on a same layer; and
  wherein along a direction of a top view of the display backplate, the second constant-voltage signal line is disposed between the storage capacitor and the first terminal.

In the display backplate of the present disclosure, area of the first electrode plate is greater than area of the second electrode plate.

The present disclosure further provides a mobile terminal, comprising the above display backplate.

Regarding the beneficial effects: the present disclosure provides a display backplate and a mobile terminal. A luminescent unit of the display backplate includes a switch transistor, a driving transistor, a luminescent component, and a storage capacitor. The driving transistor and the switch transistor are connected at a first node. The luminescent component and the driving transistor are connected at a second node. A first electrode plate of the storage capacitor is connected to the switch transistor and the driving transistor at the first node. A second electrode plate of the storage capacitor is connected to a first constant-voltage signal line. In the present disclosure, the second electrode plate of the storage capacitor is connected to the first constant-voltage signal line. Therefore, a relative area of a capacitor between a gate and a source of the driving transistor is changed from a right opposite area between the first electrode plate and the second electrode plate to a relative area between the gate and the source of the driving transistor. As such, a capacitance value between the gate and the source of the driving transistor is reduced, and risk of charge carriers entering the driving transistor is reduced. Thus, a technical issue of electrical drift occurring on driving transistors is solved, and stability of products is improved.

DESCRIPTION OF DRAWINGS

Technical solutions and beneficial effects of the present disclosure are illustrated below in detail in conjunction with drawings and specific embodiments.

DETAILED DESCRIPTION

Figure 1:
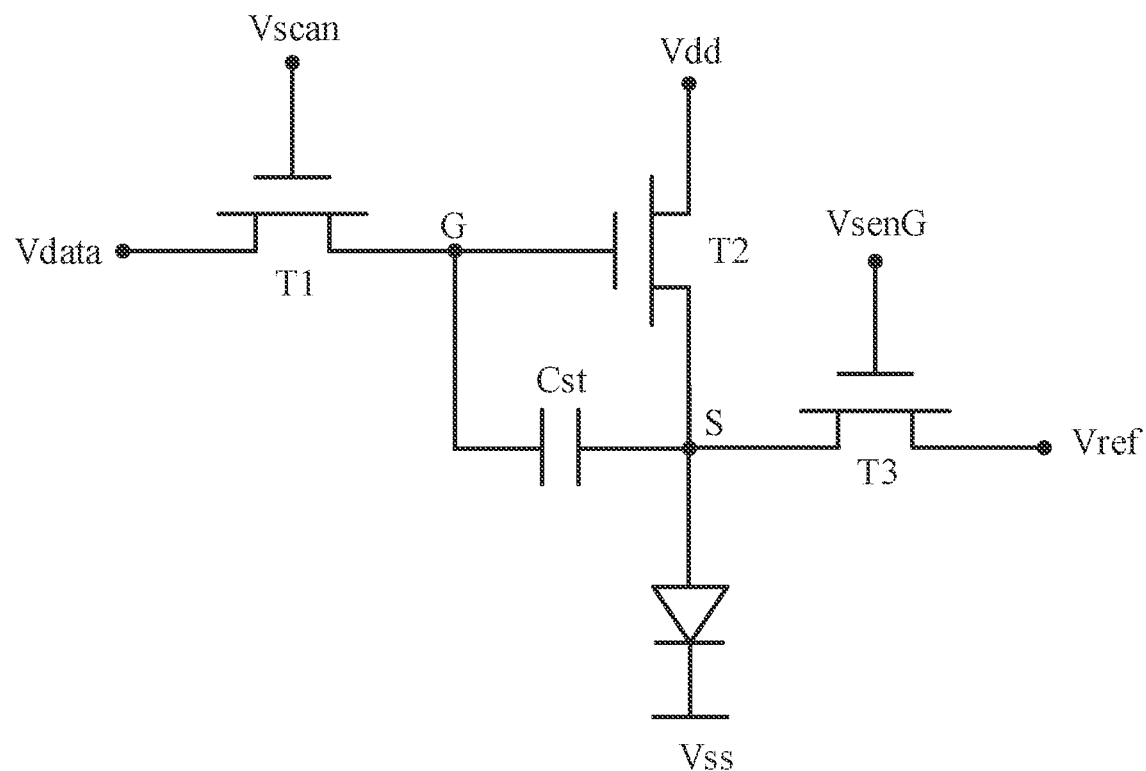
FIG. 1 is a structural schematic view showing a conventional pixel driving circuit.
Figure 2:
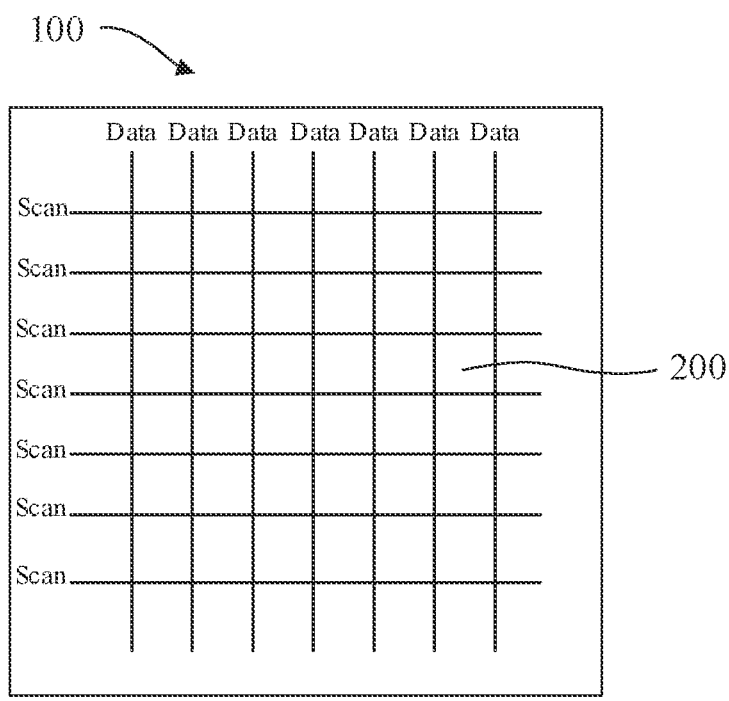
FIG. 2 is a structural schematic view showing a display backplate of the present disclosure.

Hereinafter preferred embodiments of the present disclosure will be described with reference to the accompanying drawings to exemplify the embodiments of the present disclosure can be implemented, which can fully describe the technical contents of the present disclosure to make the technical content of the present disclosure clearer and easy to understand. However, the described embodiments are only some of the embodiments of the present disclosure, but not all of the embodiments. All other embodiments obtained by those skilled in the art based on the embodiments of the present disclosure without creative efforts are within the scope of the present disclosure.

Please refer to FIGS. 2 to 10. The present disclosure provides a display backplate 100. The display backplate 100 may include a plurality of data signal lines Data and a plurality of scan signal lines Scan. The data signal lines Data and the scan signal lines Scan criss-cross each other and enclose a plurality of luminescent units 200.

In the present embodiment, each of the luminescent units 200 may include a switch transistor T1, a driving transistor T2, a luminescent component 10, and a storage capacitor Cst. The driving transistor T2 may be connected to the switch transistor T1 at a first node G. The luminescent component 10 may be connected to the driving transistor T2 at a second node S. The storage capacitor Cst may include a first electrode plate 210 and a second electrode plate 220. The first electrode plate 210 may be connected to the switch transistor T1 and the driving transistor T2 at the first node G. The second electrode plate 220 may be connected to a first constant-voltage signal line VSS.

In the present disclosure, the second electrode plate 220 of the storage capacitor Cst is connected to the first constant-voltage signal line VSS. Therefore, a relative area of a capacitor between a gate and a source of the driving transistor T2 is changed from a right opposite area between the first electrode backplate 210 and the second electrode backplate 220 to a relative area between the gate and the source of the driving transistor T2. As such a capacitance value Cgs between the gate and the source of the driving transistor T2 is reduced. Thus, risk of charge carriers entering a gate insulating layer of the driving transistor T2 is reduced, and stability of products is improved.

It should be noted that the display backplate 100 may be a direct display device. For example, a luminescent device of the luminescent component 10 may be a mini LED or a micro LED. Alternatively, the display backplate 100 may be a backlight source of display panels.

Technical solutions of the present disclosure are described as follows in conjunction with specific embodiments.

Please refer to FIGS. 2 to 10. The luminescent component 10 may include a first terminal 110, a second terminal 120, and a luminescent device electrically connected to the first terminal 110 and the second terminal 120. The first terminal 110 is connected to the driving transistor T2 at the second node S. The second terminal 120 is connected to the first constant-voltage signal line VSS.

Figure 3:
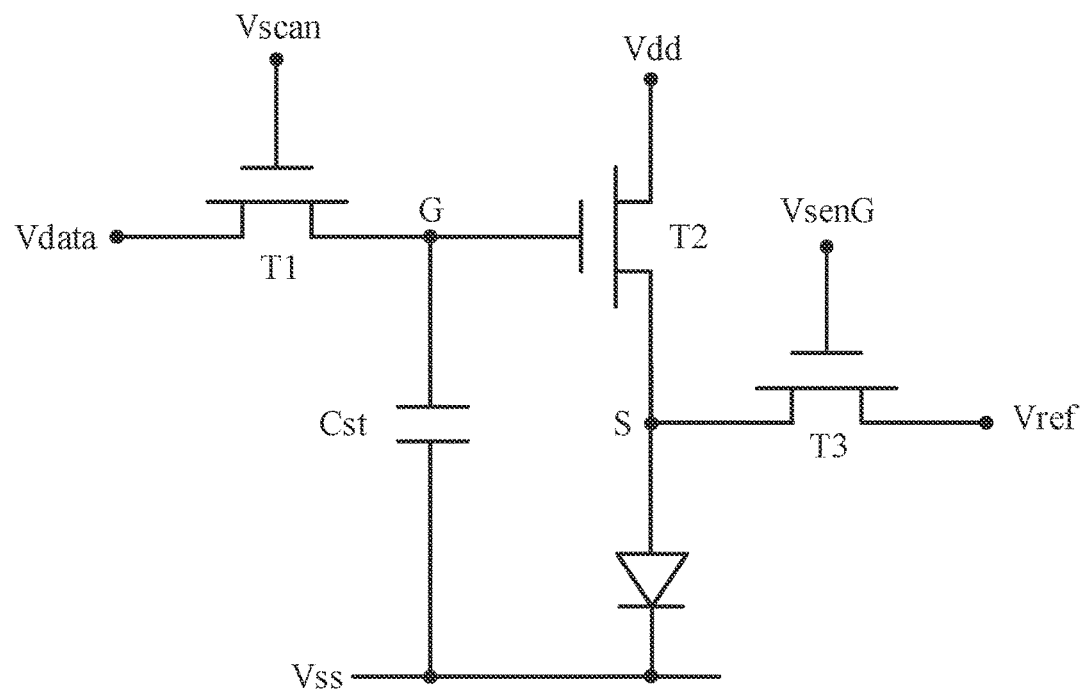
FIG. 3 is a structural schematic view showing a pixel driving circuit of the present disclosure.

Please refer to FIG. 3. Each of the luminescent units 200 may include the switch transistor T1, the driving transistor T2, the luminescent component 10, and the storage capacitor Cst. A gate of the switch transistor T1 may be connected to a first scan signal line Vscan. A drain of the switch transistor T1 may be connected to a first data signal line Vdata1. A source of the switch transistor T1 may be connected to the first node G. A gate of the driving transistor T2 may be connected to the first node G. A drain of the driving transistor T2 may be connected to a second constant-voltage signal line VDD. A source of the driving transistor T2 may be connected to the second node S. The first electrode plate 210 of the storage capacitor Cst may be connected to the first node G. The second electrode plate 20 of the storage capacitor Cst may be connected to the first constant-voltage signal line VSS. The first terminal 110 of the luminescent component 10 may be connected to the second node S. The second terminal 120 of the luminescent component 10 may be connected to the first constant-voltage signal line VSS.

In the present embodiment, the first constant-voltage signal line VSS may provide a low electrical level source with a constant voltage, and the second constant-voltage signal line VSS may provide a high electrical level source with a constant voltage.

In the present embodiment, the switch transistor T1 is turned on by a scan signal outputted by the first scan signal line Vscan. The first data signal line Vdata1 transmits a data signal to the first node G by a source and a drain of the switch transistor T1. The driving transistor T2 receives the data signal, and drives the luminescent device to emit light according to a voltage of a gate and a source of the driving transistor T2. Since the second electrode plate 220 is connected to the first constant-voltage signal line VSS, a relative area of a capacitor between the gate and the source of the driving transistor T2 is changed from a right opposite area between the first electrode backplate 210 and the second electrode backplate 220 to a relative area between the gate and the source of the driving transistor T2. As such a capacitance value Cgs between the gate and the source of the driving transistor T2 is reduced. Thus, risk of charge carriers entering a gate insulating layer of the driving transistor T2 is reduced, and a technical issue of electrical drift occurring on the driving transistor T2 is solved.

Figure 4:
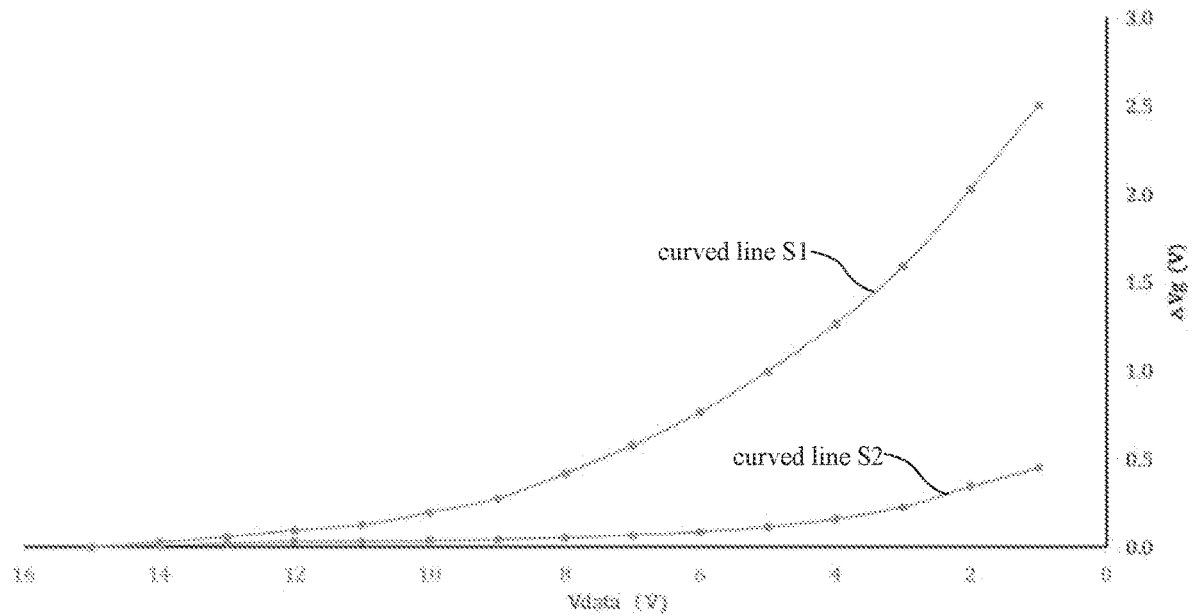
FIG. 4 is a curve comparison chart showing voltages of a first node of the pixel driving circuit of the present disclosure and voltages of a conventional first node under different data voltages.

Please refer to FIG. 4, a curved line S1 shows voltages ΔVg of the first node G of the present disclosure under different data voltages Vdata, and a curved line S2 shows voltages ΔVg of a conventional first node G under different data voltages Vdata. According to a trend of the curved line S1 and a trend of the second curved line S2, although the data voltage Vdata is increased, i.e., grayscales are changed, the voltage ΔVg of the first node G basically remains unchanged. The voltage ΔVg of the first node G does not change when a voltage ΔVs of the second node S is changed.

Figure 5:
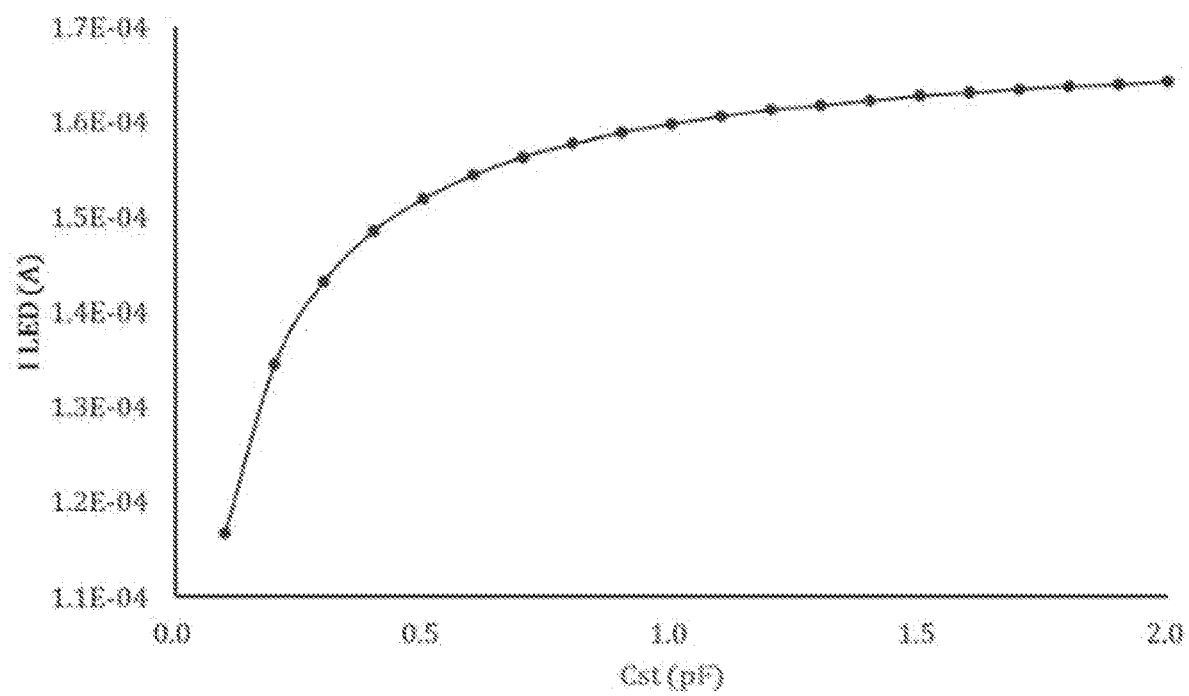
FIG. 5 is a curve chart showing driving currents of a luminescent device and capacitance values between a gate and a source of a driving transistor of the present disclosure.

Please refer to FIG. 5. According to a curved line in FIG. 5, when the capacitance value Cgs between the gate and the source of the driving transistor T2 is increased, a driving current of the pixel driving circuit provided for the luminescent device tends to be stable.

In the present embodiment, the driving transistor T2 and the switch transistor T1 may be one of a p-type transistor or an n-type transistor. For example, when the driving transistor T2 and the switch transistor T1 are n-type transistors, a corresponding transistor may be turned on by a high electrical level received by a gate. When the driving transistor T2 and the switch transistor T1 are p-type transistors, a corresponding transistor may be turned on by a low electrical level received by a gate. Types of the switch transistor T1 and the driving transistor T2 are not limited by the present disclosure.

In the present embodiment, both the second terminal 120 and the second electrode plate 220 are connected to the first constant-voltage signal line VSS. Therefore, a number of constant-voltage signal lines can be reduced, and space for layout can be increased, which simplifies a structure of the display backplate 100.

Figure 6:
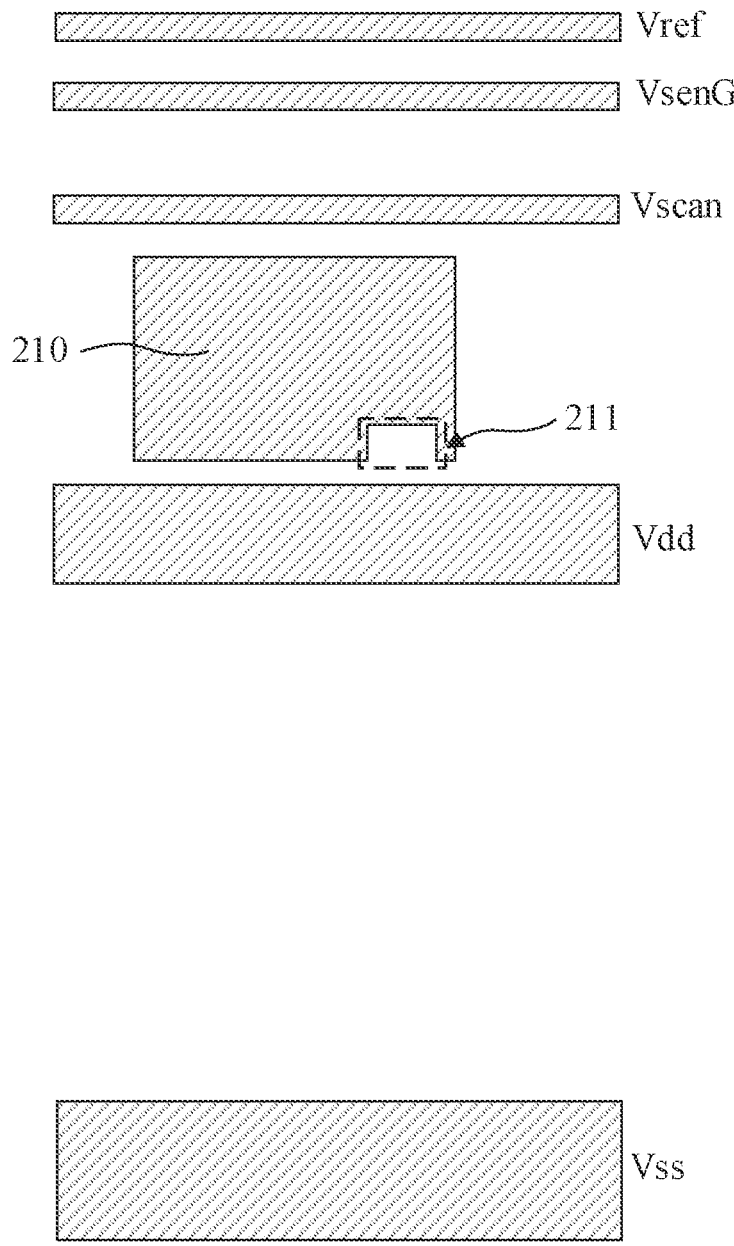
FIG. 6 is a metal pattern disposed on a same layer as a gate metal layer of a luminescent unit of the present disclosure.
Figure 7:
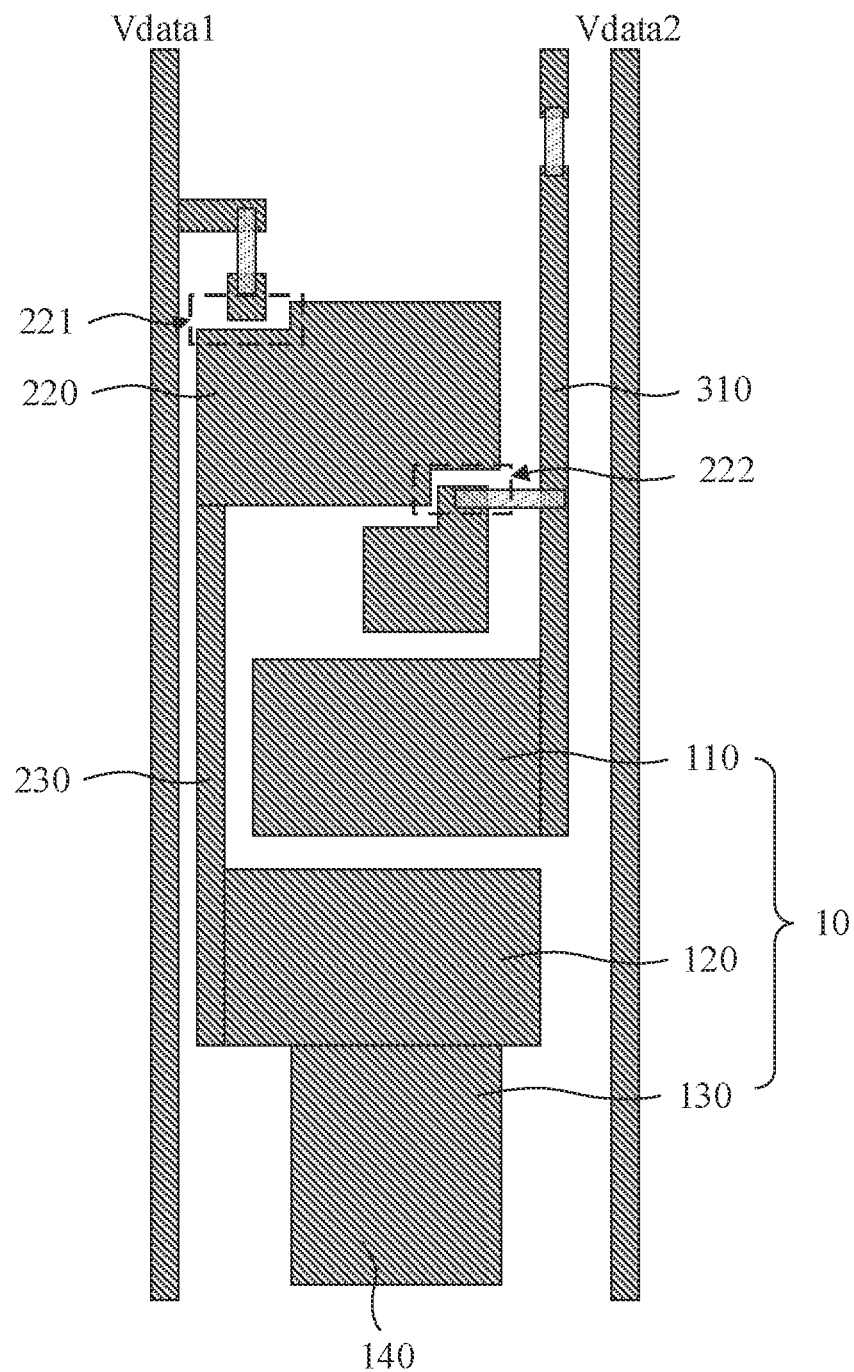
FIG. 7 is a metal pattern disposed on a same layer as a source/drain metal layer of the luminescent unit of the present disclosure.
Figure 8:
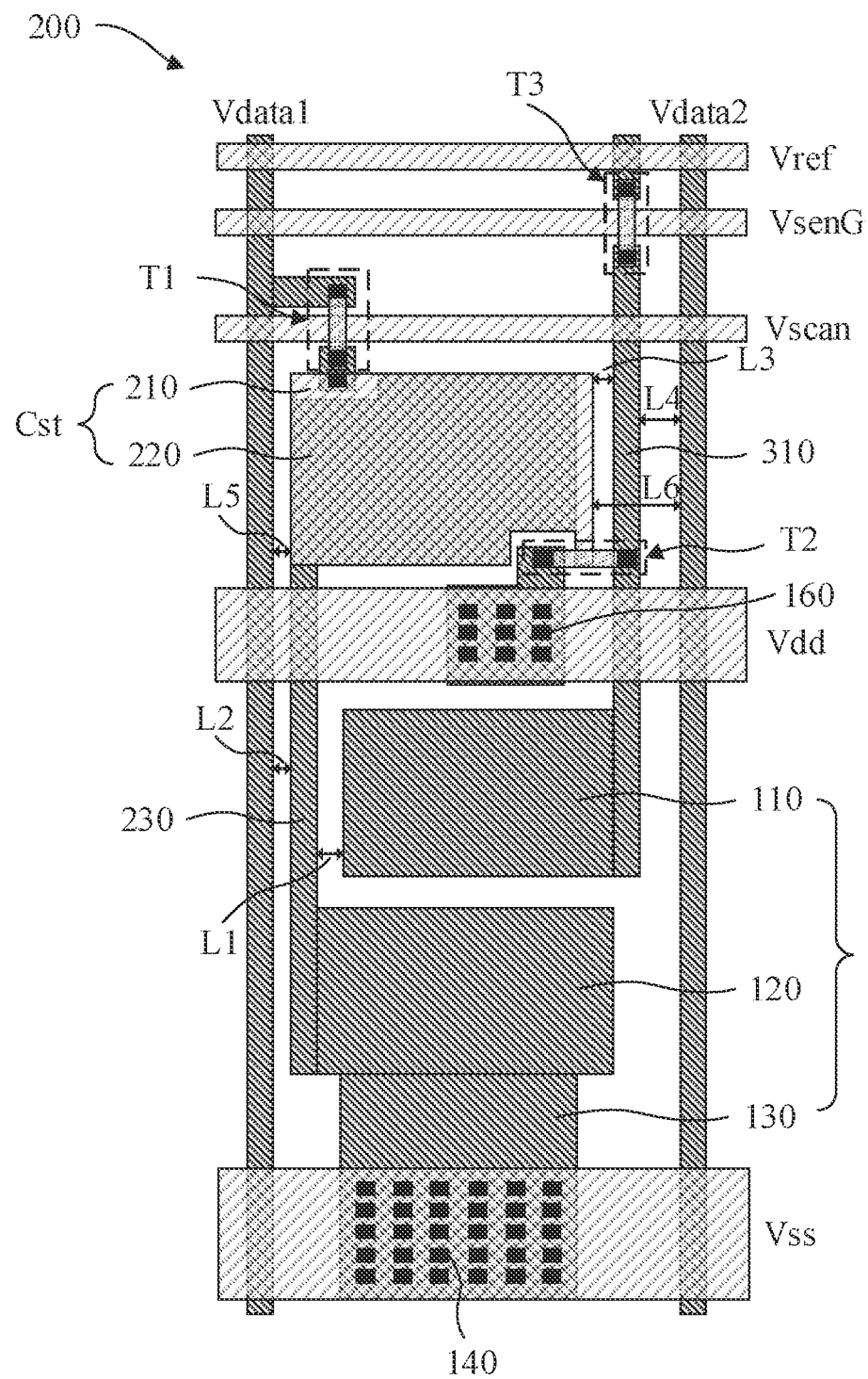
FIG. 8 is a first view showing a stacked structure of different metal layers of the luminescent unit of the present disclosure.

Please refer to FIGS. 6 to 8. FIG. 8 shows a stacked structure of FIG. 6 and FIG. 7. In the display backplate 100 of the present disclosure, each of the luminescent units 200 may further include a first connecting line 230 disposed between the first data signal line Vdata of the first terminal 110 and the display backplate 100. The first connecting line 230, the first terminal 110, and the first data signal line Vdata1 are insulated from each other. The first connecting line 230 extends from the storage capacitor Cst to the second terminal 120. The second electrode plate 220 is electrically connected to the second terminal 120 by the first connecting line 230.

In the present embodiment, the storage capacitor Cst, the first terminal 110, and the second terminal 120 are sequentially arranged along a direction of the first data signal line Vdata1. The first connecting line 230 extends from the second electrode plate 220 to the second terminal 120. The first connecting line 230 may extend between the first data signal line Vdata1 and the first terminal 110. The first connecting line 230, the first data signal line Vdata1, and the first terminal 110 are insulated from each other.

In the present embodiment, the storage capacitor Cst, the first terminal 110, and the second terminal 120 are sequentially arranged along a direction of the first data signal line Vdata1. The first connecting line 230 extends from the second electrode board 220 to the second terminal 120. The first connecting line 230 may extend between the first data signal line Vdata1 and the first terminal 110. The first connecting line, the first data signal line Vdata1, and the first terminal 110 are insulated from each other.

In the present embodiment, the second electrode plate 220 is connected to the second terminal 120 by the first connecting line 230. The second terminal 120 is electrically connected to the first constant-voltage signal line VSS. The first constant-voltage signal line VSS transmits a constant-voltage source to the second electrode plate 220 by the second terminal 120 and the first connecting line 230. In addition, because the first constant-voltage signal line VSS and the second terminal 120 are formed of different metal layers, the first constant-voltage signal line VSS and the second terminal 120 need to be electrically connected to each other by a through-hole. The second electrode plate 220 is electrically connected to the second terminal 120 by the first connecting line 230. As such, a number of throughholes does not need to be increased, and a length of the first connecting line 230 is reduced, ensuring reliability of connection between the first constant-voltage signal line VSS and the second electrode plate 220.

Please refer to FIGS. 6 to 8. The luminescent component 10 may further include an extension section 130 connected to the second terminal 120. The extension section 130 partly overlaps the first constant-voltage signal line VSS. The first constant-signal line VSS is electrically connected to the extension section 130 by a plurality of first through-holes 140.

In conventional luminescent components 10, a first terminal 110 and a second terminal 120 generally have a same area to ensure electrical connection between a luminescent device, the first terminal 110, and the second terminal 120. However, in the present disclosure, the first connecting line 230 is disposed on a side of the second terminal 120 close to the first data signal line Vdata1. If the conventional first terminal 110 is applied, the first connecting line 230 and the second terminal 120 cannot be connected to each other.

In the present embodiment, as shown in FIGS. 6 to 8, the first terminal 110 and the second terminal 120 have different area. The second terminal 120 extends to the first data signal line Vdata1, making a side of the first data signal line Vdata1 close to the first connecting line 230 aligned with a side of the second terminal 120 close to the first connecting line 230.

In the present embodiment, along a direction of the first data signal line Vdata1, the first terminal 110 and the second terminal 120 have a same size. Along a direction of the first scan signal line Vscan, the first terminal 110 and the second terminal 120 have different sizes.

In the present embodiment, the first connecting line 230 may be parallel to the first data signal line Vdata1.

Figure 9:
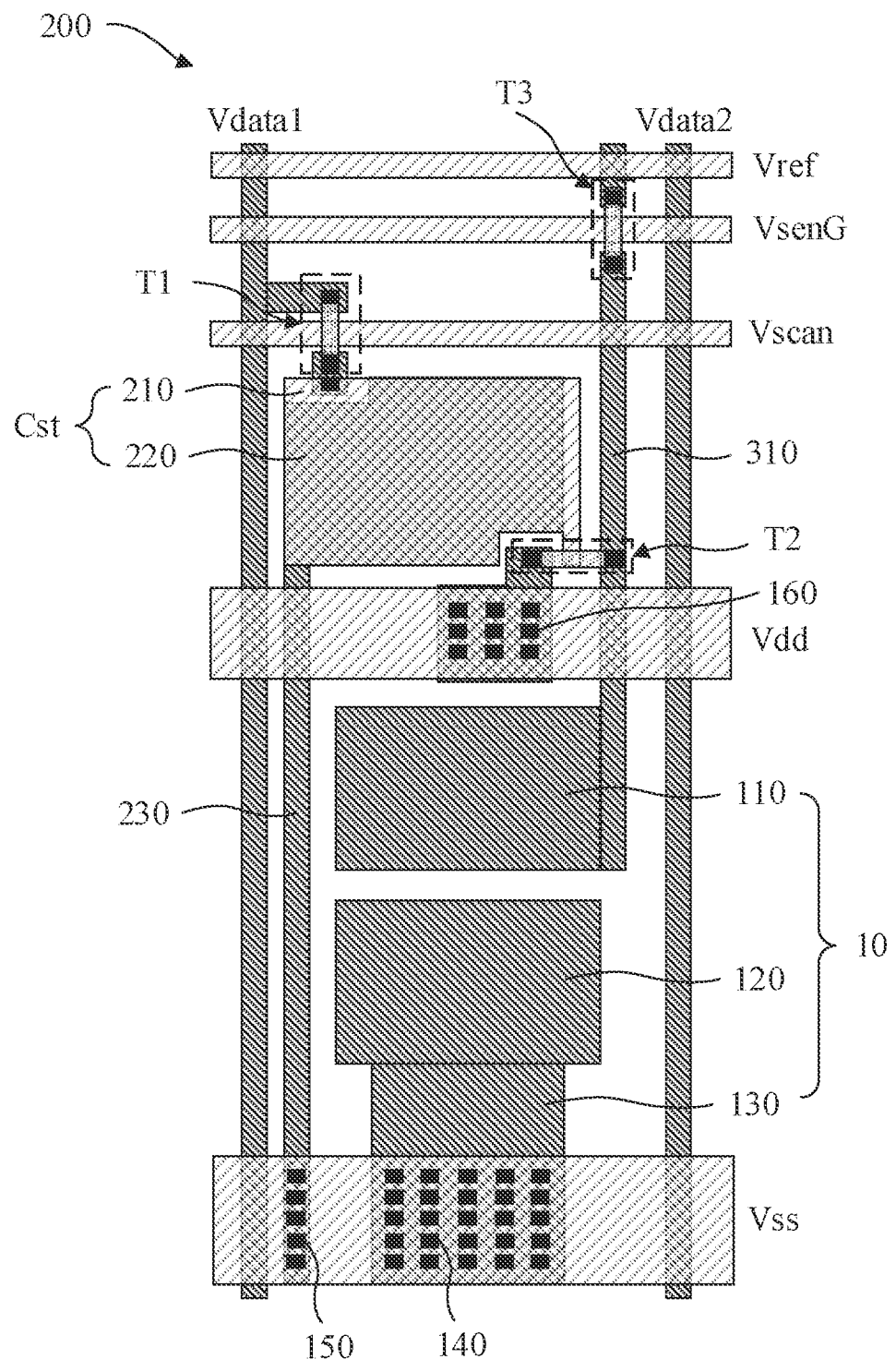
FIG. 9 is a second view showing a stacked structure of different metal layers of the luminescent unit of the present disclosure.

Please refer to FIG. 9. The first connecting line 230 extends from the storage capacitor Cst to the first constant-voltage signal line VSS. The first connecting line 230 is disposed between the second terminal 120 and the first data signal line Vdata1. The first connecting line 230 is isolated from the second terminal 120. The second electrode plate 220 is directly connected to the first constant-voltage signal line VSS by the first connecting line 230 and a plurality of second through-holes 150.

In the present embodiment, the first connecting line 230 is not connected to the first constant-voltage signal line VSS by the second terminal 120. The first connecting line 230 directly extends to the first constant-voltage signal line VSS and is connected to the first constant-voltage signal line VSS by the second through-holes 150. The second terminal 120 does not need to be redesigned, and may have same area as conventional second terminals 120.

Figure 10:
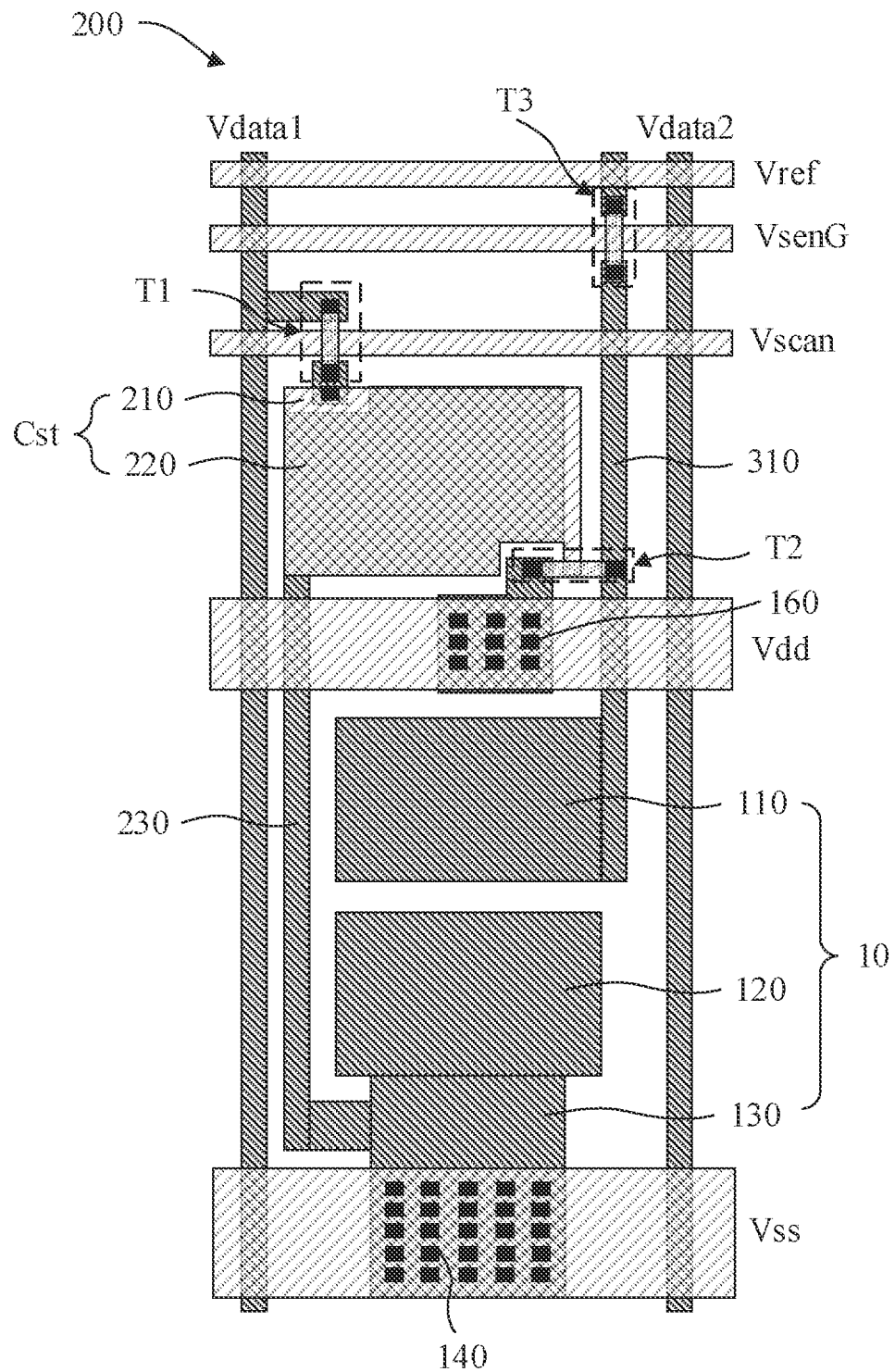
FIG. 10 is a third view showing a stacked structure of different metal layers of the luminescent unit of the present disclosure.

Please refer to FIG. 10. The first connecting line 230 extends from the storage capacitor Cst to the first constant-voltage signal line VSS. The first connecting line 230 is disposed between the second terminal 120 and the first data signal line Vdata1. The first connecting line 230 is isolated from the second terminal 120. The second electrode plate 220 is electrically connected to the extension section 130 by the first connecting line 230. In the present embodiment, the first connecting line 230 is not connected to the first constant-voltage signal line VSS by the second terminal 120. The first constant-voltage signal line VSS transmits a constant-voltage source to the second electrode plate 220 by the extension section 130 and the first connecting line 230. Therefore, the second terminal 120 does not need to be redesigned, and may have same area as conventional section terminals 120.

As shown in FIGS. 6 to 10, in the display backplate 100 of the present disclosure, along the direction of the first scan signal line Vscan of the display backplate 100, a distance L1 between the first connecting line 230 and the first terminal 110 is less than a distance L2 between the first connecting line 230 and the first data signal line Vdata1.

In the present embodiment, the first connecting line 230 is electrically connected to the first constant-voltage signal line VSS. The first connecting line 230 has a constant-voltage source. A voltage is applied to both first data signal line Vdata1 and the first terminal 110. Therefore, corresponding parasitic capacitance is generated in the first connecting line 230, the first data signal line Vdata1, and the first terminal 110. However, because a relative area between the first connecting line 230 and the first data signal line Vdata1 is greater than a relative area between the first connecting line 230 and the first terminal 110, parasitic capacitance between the first connecting line 230 and the first data signal line Vdata1 is greater than parasitic capacitance between the first connecting line 230 and the first terminal 110.

In the present embodiment, to prevent effects of parasitic capacitance on circuits, the distance between the first connecting line 230 and the first data signal line Vdata1 is made to be less than the distance between the first connecting line 230 and the first terminal 110. An increase in the distance between the first connecting line 230 and the first data signal line Vdata reduces an amount of parasitic capacitance between the first connecting line 230 and the first data signal line Vdata. Therefore, parasitic capacitance between the first connecting line 230 and the first data signal line Vdata and parasitic capacitance between the first connecting line 230 and the first terminal 110 can be balanced, improving stability of a pixel circuit disposed in the luminescent units 200.

As shown in FIGS. 6 to 10, in the display backplate 100 of the present disclosure, each of the luminescent units 200 further includes a reset transistor T3. The reset transistor T3, the driving transistor T2, and the luminescent component 10 are connected at the second node S.

In the present embodiment, each of the luminescent units 200 further includes a second scan signal line VsenG and a reset data signal line Vref. The second scan signal line VsenG is connected to a gate of the reset transistor T3. The reset data signal line Vref is connected to a drain of the reset transistor T3. A source of the reset transistor T3 is connected to the second node S.

After the luminescent units 200 emit light, the second node S may not achieve a predetermined electric potential. Consequentially, a driving current of the luminescent device deviates from a predetermined current, resulting in abnormality of the luminescent units 200. Before the luminescent units 200 work or after the luminescent units 200 emit light, the gate of the reset transistor T3 receives a reset scan signal outputted by the second scan signal line VsenG to turn on the reset transistor T3. The reset data signal line Vref transmits a reset signal from the drain of the reset transistor T3 to the source of the reset transistor T3, thereby resting an electric potential of the second node S to make the electric potential of the second node S reach a predetermined electric potential.

As shown in FIGS. 6 to 10, in the present embodiment, each of the luminescent units 200 further includes a second connecting line 310. The second connecting line 310 is disposed between the storage capacitor Cst and a second data signal line Vdata2 of the display backplate 100. The first data signal line Vdata1 and the second data signal line Vdata2 are parallel and opposite to each other. The second connecting line 310 extends to the driving transistor T2 and the first terminal 110 from the reset transistor T3. The reset transistor T3 is electrically connected to the first terminal 110 and the driving transistor T2 by the second connecting line 310. The driving transistor T2 is disposed between the reset transistor T3 and the first terminal 110.

In the present embodiment, a second connecting section of the second connecting line 310 is electrically connected to an end surface of a side of the first terminal 110 close to the second data signal line Vdata2.

In the present embodiment, the second connecting line 310 may be parallel to the first data signal line Vdata1 and the second data signal line Vdata2.

In the present embodiment, a distance L3 between the second connecting line 310 and the storage capacitor Cst is greater than a distance L4 between the second connecting line 310 and the second data signal line Vdata2.

In the present embodiment, a corresponding parasitic capacitance is generated in the second connecting line 310, the second data signal line Vdata2, and the storage capacitor Cst. However, because a relative area between the second connecting line 310 and the second data signal line Vdata2 is greater than a relative area between the second connecting line 310 and the storage capacitor Cst, parasitic capacitance generated between the second connecting line 310 and the second data signal line Vdata2 is greater than parasitic capacitance generated between the second connecting line 310 and the storage capacitor Cst.

In the present embodiment, to prevent effects of parasitic capacitance on circuits, the distance between storage capacitor Cst and the second data signal line Vdata2 is less than the distance between the storage capacitor Cst and the second connecting line 310. An increase in the distance between the storage capacitor Cst and the second connecting line 310 reduces an amount of parasitic capacitance between the storage capacitor Cst and the second connecting line 310. Therefore, parasitic capacitance between the second connecting line 310 and the second data signal line Vdata2 and parasitic capacitance between the second connecting line 310 and the storage capacitor Cst can be balanced, improving stability of a pixel circuit disposed in the luminescent units 200.

As shown in FIGS. 6 to 10. In the display backplate 100 of the present disclosure, along the direction of the first scan signal line Vscan of the display backplate 100, a distance L5 between the storage capacitor Cst and the first data signal line Vdata1 is less than a distance L6 between the storage capacitor Cst and the second data signal line Vdata2.

In the present embodiment, an interval needs to be reserved between the storage capacitor Cst and the second data signal line Vdata2 for the second connecting line 310, thereby preventing short-circuiting between the second connecting line 310, the storage capacitor Cst, and the second data signal line Vdata2 which results in overly great parasitic capacitance between the second connecting line 310, the storage capacitor Cst, and the second data signal line Vdata2. In addition, there is no other metal line disposed between the storage capacitor Cst and the first data signal line. Therefore, in the present disclosure, the distance between the storage capacitor Cst and the first data signal line Vdata1 is made to be less than the distance between the storage capacitor Cst and the second data signal line Vdata2, thereby preventing overly great parasitic capacitance between the storage capacitor Cst and the second connecting line 310. Also, a minimum distance between the storage capacitor Cst and the first data signal line Vdata1 is ensured, thereby enlarging space for layout and simplifying a structure of the display backplate 100.

As shown in FIGS. 6 to 10, in the present disclosure, the display backplate 100 further includes a second constant-voltage signal line VDD electrically connected to the driving transistor T2. The second constant-voltage signal line VDD and the first constant-voltage signal line VSS may be disposed on a same layer. In a top view of the display backplate 100, the second constant-voltage signal line VDD is disposed between the storage capacitor Cst and the first terminal 110.

In the present embodiment, considering an arrangement of the driving transistor T2, the second constant-voltage signal line VDD is disposed between the storage capacitor Cst and the first terminal 110, and may be parallel to the first constant-voltage signal line VSS and the first scan signal line Vscan. The drain of the driving transistor T2 may be electrically connected to the second constant-voltage signal line VDD by a plurality of third through-holes 160.

As shown in FIGS. 6 to 10, in the display backplate 100 of the present disclosure, the first terminal 110, the second terminal 120, the second electrode 220, the first connecting line 230, the second connecting line 310, the first data signal line Vdata1, and the second data signal line Vdata2 may be formed of a first metal layer. The first electrode plate 210, the first scan signal line Vscan, and the first constant-voltage signal line VSS may be formed of a second metal layer. The first metal layer and the second metal layer are disposed on different layers.

In the present embodiment, the first metal layer may be disposed on a same layer as a source/drain layer. That is, when the first metal layer is formed, the first terminal 110, the second terminal 120, the second electrode plate 220, the first connecting line 230, the second connecting line 310, the first data signal line Vdata1, the second data signal line Vdata2, and a source and a drain of different transistors may be simultaneously formed by a patterning process. The second metal layer may be disposed on a same layer as a gate layer. That is, when the second metal layer is formed, the first electrode plate 210, the first scan signal line Vscan, the first constant-voltage signal line VSS, the second constant-voltage signal line VDD, the second scan signal line VsenG, and the reset data signal line Vref may be simultaneously formed by a patterning process.

In the present embodiment, a positional relationship between the first metal layer and the second metal layer is not limited. For example, the first metal layer may be formed on the second metal layer, or the second metal layer may be formed on the first metal layer.

As shown in FIGS. 6 to 10, in the display backplate 100 of the present disclosure, area of the first electrode plate 210 may be greater than area of the second electrode plate 220.

In the present embodiment, the second electrode plate 220 may be electrically connected to the second terminal 120 by only the first connecting line 230. The first electrode plate 210 needs to be electrically connected to the source of the switch transistor T1 and the gate of the driving transistor T2.

In the present embodiment, the second electrode plate 220 may have an irregular shape. For example, the second electrode plate 220 is a rectangle having a notch at each end of a diagonal. An upper left corner of the second electrode plate 220 corresponds to the switch transistor T1. A lower right corner of the second electrode plate 220 corresponds to the driving transistor T2. That is, the second electrode plate 220 includes a first notch 221 close to the switch transistor T1 and a second driving notch 222 close to the driving transistor T2. In addition, because the second electrode plate 220, the switch transistor T1, and the source and the drain of the driving transistor T2 are formed of the first metal layer, two notches are respectively defined at two ends of a diagonal of the second electrode plate 220 to prevent short-circuiting between the second electrode plate 220, the switch transistor T1, and the source and the drain of the driving transistor T2.

In the present embodiment, the first electrode plate 220 may have an irregular shape. For example, the first electrode plate 210 may include a third notch 211 corresponding to the driving transistor T2. The first electrode plate 210 is formed of the second metal layer, the first electrode plate 210 and the source and the drain of the switch transistor T1 are disposed on different layers, and the first electrode plate 210 needs to be electrically connected to the switch transistor T1. Therefore, a part of the first electrode plate 210 corresponding to the first notch 221 is not removed, and this part covers the source of the switch transistor T1. In addition, although the first electrode plate 210 and the source and the drain of the driving transistor T2 are disposed on different layers, to reduce a relative area between the first electrode plate 210 and the driving transistor T2, the third notch 211 is defined on the first electrode plate 210. Therefore, capacitance between the gate and the drain of the driving transistor T2 can be reduced.

The present disclosure further provides a mobile terminal, including a main terminal body and the above display backplate 100. The main terminal body and the display backplate 100 are integrated with each other. For example, when the display backplate 100 is a backlight source, the main terminal body may be a liquid crystal display panel. The display backplate 100 and the liquid crystal display panel are combined to form the mobile terminal. When the display backplate 100 is a direct display device, the main terminal body may be a circuit board bonded to a display panel or a cover plate covering the display panel. The mobile terminal may include electronic devices such as cell phones, televisions, or notebooks.

The present disclosure provides a display backplate and a mobile terminal. A luminescent unit of the display backplate includes a switch transistor, a driving transistor, a luminescent component, and a storage capacitor. The driving transistor and the switch transistor are connected at a first node. The luminescent component and the driving transistor are connected at a second node. A first electrode plate of the storage capacitor is connected to the switch transistor and the driving transistor at the first node. A second electrode plate of the storage capacitor is connected to a first constant-voltage signal line. In the present disclosure, the second electrode plate of the storage capacitor is connected to the first constant-voltage signal line. Therefore, a relative area of a capacitor between a gate and a source of the driving transistor is changed from a right opposite area between the first electrode plate and the second electrode plate to a relative area between the gate and the source of the driving transistor. As such, a capacitance value between the gate and the source of the driving transistor is reduced, and risk of charge carriers entering the driving transistor is reduced. Thus, a technical issue of electrical drift occurring on driving transistors is solved, and stability of products is improved.

In the above embodiments, the focus of each embodiment is different, and for a part that is not detailed in an embodiment, reference may be made to related descriptions of other embodiments.

A display backplate and a mobile terminal have been described in detail with embodiments provided by the present disclosure which illustrates principles and implementations thereof. However, the description of the above embodiments is only for helping to understand the technical solution of the present disclosure and core ideas thereof, and it is understood by those skilled in the art that many changes and modifications to the described embodiment can be carried out without departing from the scope and the spirit of the disclosure that is intended to be limited only by the appended claims.

What is claimed is:

1. A display backplate, comprising a plurality of luminescent units, wherein each of the luminescent units comprises:
   a switch transistor;
   a driving transistor connected to the switch transistor at a first node;
   a luminescent component connected to the driving transistor at a second node; and
   a storage capacitor, wherein the storage capacitor comprises a first electrode plate and a second electrode plate, the first electrode plate is connected to the switch transistor and the driving transistor at the first node, and the second electrode plate is connected to a first constant-voltage signal line;
   wherein the luminescent component comprises a first terminal, a second terminal, and a luminescent device electrically connected to the first terminal and the second terminal; and
   wherein the first terminal is connected to the driving transistor at the second node, and the second terminal is connected to the first constant-voltage signal line;
   wherein each of the luminescent units comprises a first connecting line disposed between the first terminal and a first data signal line of the display backplate, and the first connecting line is insulated from the first terminal and the first data signal line; and
   wherein the first connecting line extends from the first constant-voltage signal line and is electrically connected to the first constant-voltage signal line.

2. The display backplate of claim 1, wherein the first connecting line extends from the storage capacitor to the second terminal, and the second electrode plate is electrically connected to the second terminal.

3. The display backplate of claim 1, wherein the first connecting line is disposed between the second terminal and the first data signal line, the first connecting line is isolated from the second terminal, and the second electrode plate is electrically connected to the first constant-voltage signal line by a plurality of first through-holes.

4. The display backplate of claim 1, wherein along a direction of a first scan signal line of the display backplate, a distance between the first connecting line and the first terminal is less than a distance between the first connecting line and the first data signal line.

5. The display backplate of claim 1, wherein each of the luminescent units comprises a reset transistor, and the reset transistor is connected to the driving transistor and the luminescent component at the second node;
   wherein each of the luminescent units comprises a second connecting line, the second connecting line is connected between the storage capacitor and a second data signal line of the display backplate, and the first data signal line is opposite and parallel to the second data signal line; and
   wherein the second connecting line extends from the reset transistor to driving transistor and the first terminal, the reset transistor is electrically connected to the first terminal and the driving transistor by the second connecting line, and the driving transistor is disposed between the reset transistor and the first terminal.

6. The display backplate of claim 5, wherein along a direction of a first scan signal line of the display backplate, a distance between the storage capacitor and the first data signal line is less than a distance between the storage capacitor and the second data signal line.

7. The display backplate of claim 5, wherein the first terminal, the second terminal, the second electrode plate, the first connecting line, the second connecting line, the first data signal line, and the second data signal line are formed of a first metal layer; and
   the first electrode plate, the first scan signal line, and the first constant-voltage signal line are formed of a second metal layer, and the first metal layer and the second metal layer are disposed on different layers.

8. The display backplate of claim 7, wherein the display backplate comprises a second constant-voltage signal line electrically connected to the driving transistor, and the second constant-voltage signal line and the first constant-voltage signal line are disposed on a same layer; and
   wherein along a direction of a top view of the display backplate, the second constant-voltage signal line is disposed between the storage capacitor and the first terminal.

9. The display backplate of claim 1, wherein area of the first electrode plate is greater than area of the second electrode plate.

10. The display backplate of claim 9, wherein the second electrode plate comprises a first notch close to the switch transistor and a second notch close to the driving transistor, and the first electrode plate comprises a third notch close to the driving transistor.

11. A mobile terminal, comprising a display backplate, comprising a plurality of luminescent units, wherein each of the luminescent units comprises:
    a switch transistor;

a driving transistor connected to the switch transistor at a first node;

a luminescent component connected to the driving transistor at a second node; and a storage capacitor, wherein the storage capacitor comprises a first electrode plate and a second electrode plate, the first electrode plate is connected to the switch transistor and the driving transistor at the first node, and the second electrode plate is connected to a first constant-voltage signal line;

wherein the luminescent component comprises a first terminal, a second terminal, and a luminescent device electrically connected to the first terminal and the second terminal; and wherein the first terminal is connected to the driving transistor at the second node, and the second terminal is connected to the first constant-voltage signal line;

wherein each of the luminescent units comprises a first connecting line disposed between the first terminal and a first data signal line of the display backplate, and the first connecting line is insulated from the first terminal and the first data signal line; and wherein the first connecting line extends from the first constant-voltage signal line and is electrically connected to the first constant-voltage signal line.

* * * * *